United States Patent [19]
Mizan et al.

[11] Patent Number: 5,339,047
[45] Date of Patent: Aug. 16, 1994

[54] X-BAND BIPOLAR JUNCTION TRANSISTOR AMPLIFIER

[75] Inventors: Muhammad A. Mizan, Ocean; Raymond C. McGowan, Neptune, both of N.J.

[73] Assignee: The United States of America as represented by the Secretary of the Army, Washington, D.C.

[21] Appl. No.: 18,969

[22] Filed: Feb. 18, 1993

[51] Int. Cl.$^5$ ............................................. H03F 3/60
[52] U.S. Cl. ................................. 330/286; 330/306; 333/33
[58] Field of Search ................... 330/306, 286; 333/33

[56] References Cited

PUBLICATIONS

Schwaderer et al., "Kettenverstärker mit bipolaren Siliziumtransistoren: 250 MHz bis 6 GHz," Nov. 6, 1981 p. 1.
Kotzebue et al., "Design technique for broadband microwave transistor power amplifiers", May 1979 p. 125.
Young, "Speed uhf microstrip amplifier design" Oct. 12, 1992 p. 80.
"Proceedings of the 43rd Annual Symposium on Frequency Control 1989" Cosponsored by the U.S. Army Electronics Technology and Devices Laboratory and The Institute of Electrical and Electronics Engineers, Inc., Ultrasonics, Ferroelectrics and Frequency Control Society, IEEE Catalog No. 89CH2690-6, May 31–Jun. 2, 1989.

*Primary Examiner*—James B. Mullins
*Assistant Examiner*—J. Dudek
*Attorney, Agent, or Firm*—Michael Zelenka; William H. Anderson

[57] ABSTRACT

An X-band (8–12.5 GHz) amplifier comprises a bipolar junction transistor (BJT) arranged for receiving an X-band signal, amplifying the signal and providing the amplified signal to further circuitry. Input and output matching networks are advantageously provided for the BJT. Each network may have a first end for connection to a BJT and a second end for connection to a terminal, and may comprise a series connection of a first inductor, a first capacitor and a second inductor extending from the first end to the second end in that order; a third inductor connected between ground and the connection point of the first capacitor and the second inductor; and a second capacitor connected between ground and the second end. The various reactance components may be implemented on a dielectric board, for example by microstriplines and/or shaped cladding portions. An X-band oscillator may comprise the X-band amplifier described above, and a feedback circuit interconnecting an output and an input of the amplifier. The feedback circuit may comprise first and second feedback means, for example microstriplines, which may be coupled to a dielectric resonator.

10 Claims, 4 Drawing Sheets

X-BAND BIPOLAR JUNCTION TRANSISTOR AMPLIFIER

STATEMENT OF GOVERNMENT INTEREST

The present invention described herein may be manufactured, used, and licensed by or for the United States Government without the payment to me of any royalties thereon.

FIELD OF THE INVENTION

The present invention relates to the field of microwave signal processing circuitry and, more particularly, to amplifier circuits which provide low-noise, small-signal amplification in the X-band, an oscillator circuits which include such amplifier circuits.

BACKGROUND OF THE INVENTION

Military and commercial communication and radar systems have a critical need for reliable, low-noise, high-efficiency, solid-state amplifiers, particularly for use in oscillator circuitry.

The performance of a microwave feedback oscillator such as a dielectric resonator oscillator (DRO) or cavity oscillator is limited by the 1/f noise of the loop amplifiers. At low frequencies (below 4 GHz), bipolar junction transistor (BJT) amplifiers have generally been employed in the oscillator circuits because of their excellent noise characteristics. However, for higher frequencies (over 4 GHz), such as in the X-band, gallium arsenide field effect transistor (GaAs FET) amplifiers have been employed, although they have poorer noise characteristics than BJT amplifiers, because of the lack of a two-port BJT amplifier. A comparison of the respective phase noise characteristics of GaAs FET and BJT amplifiers is set forth in Montress et al., "Residual Phase Noise Measurements of VHF, LIHF and Microwave Components," Proceedings of the 43rd Annual Frequency Control Symposium, IEEE Catalog No. 89CH2690-6, June 1989.

Thus, the primary reason for the utilization of GaAs FET amplifiers in these oscillators instead of BJT amplifiers is that, to date, a two-port BJT amplifier has not been developed for operation at these higher frequencies. However, as may be readily appreciated by those skilled in the art, the incorporation of BJT amplifiers in oscillators operating at higher frequencies would greatly improve their performance. Since the close-in phase-noise performance of known two-port amplifiers and oscillators currently employed in the X-band is limited by the performance of the GaAs FETs, introduction of BJTs for these higher frequency applications would result in an improvement in the system noise floor.

SUMMARY OF THE INVENTION

Accordingly, it is an object of the present invention to provide a low-phase-noise X-band amplifier.

A further object is to provide a two-port BJT amplifier which may be readily incorporated in a high frequency microwave feedback oscillator.

According to one aspect of the invention, an X-band (8-12 GHz) amplifier comprises a BJT arranged for receiving an X-band signal, amplifying the signal and providing the amplified signal to further circuitry.

Input and output matching networks are advantageously provided for the BJT. Each network may have a first end for connection to a BJT and a second end for connection to a terminal, and may comprise a series connection of a first inductor, a first capacitor and a second inductor extending from the first end to the second end in that order; a third inductor connected between ground and the connection point of the first capacitor and the second inductor; and a second capacitor connected between ground and the second end.

According to another aspect of the invention, the various reactance components may be implemented on a dielectric board, for example by microstriplines and/or shaped cladding portions.

According to a further aspect, an X-band oscillator may comprise the X-band amplifier described herein, and a feedback circuit interconnecting an output and an input of the amplifier. The feedback circuit may comprise first and second feedback means, for example microstriplines, which may be coupled to a dielectric resonator.

The high frequency BJT amplifier discussed herein is capable of providing a noise level of −145 dBc/Hz or better at 100 Hz offset frequency at an operating frequency of 8.7 GHz (X-band). Typical GaAs amplifiers exhibit a noise level of −125 dBc/Hz at this frequency. Thus, the BJT amplifier has the potential to improve a microwave oscillator's phase noise by as much as 20 dB. It should be noted that the dynamic range of a radar system is usually limited by the frequency source of the system.

The enhanced phase-noise performance of this invention is a significant improvement over present systems operating in this frequency regime, approximately 8-12.4 GHz. A major advantage of the X-band BJT amplifier is that the close-in residual phase noise of a BJT is about 10 to 30 dB better than that of a gallium arsenide field effect transistor (GaAs FET).

Other features and advantages of the present invention will become apparent from the following description of the invention which refers to the accompanying drawings.

BRIEF DESCRIPTION OF THE DRAWINGS

Other features and advantages of the present invention will become apparent from the following description of the invention which refers to the accompanying drawings.

FIG. 5 is a schematic diagram of a dielectric resonator oscillator incorporating the X-band BJT amplifier.

DETAILED DESCRIPTION OF EMBODIMENTS OF THE INVENTION

Figure 1:
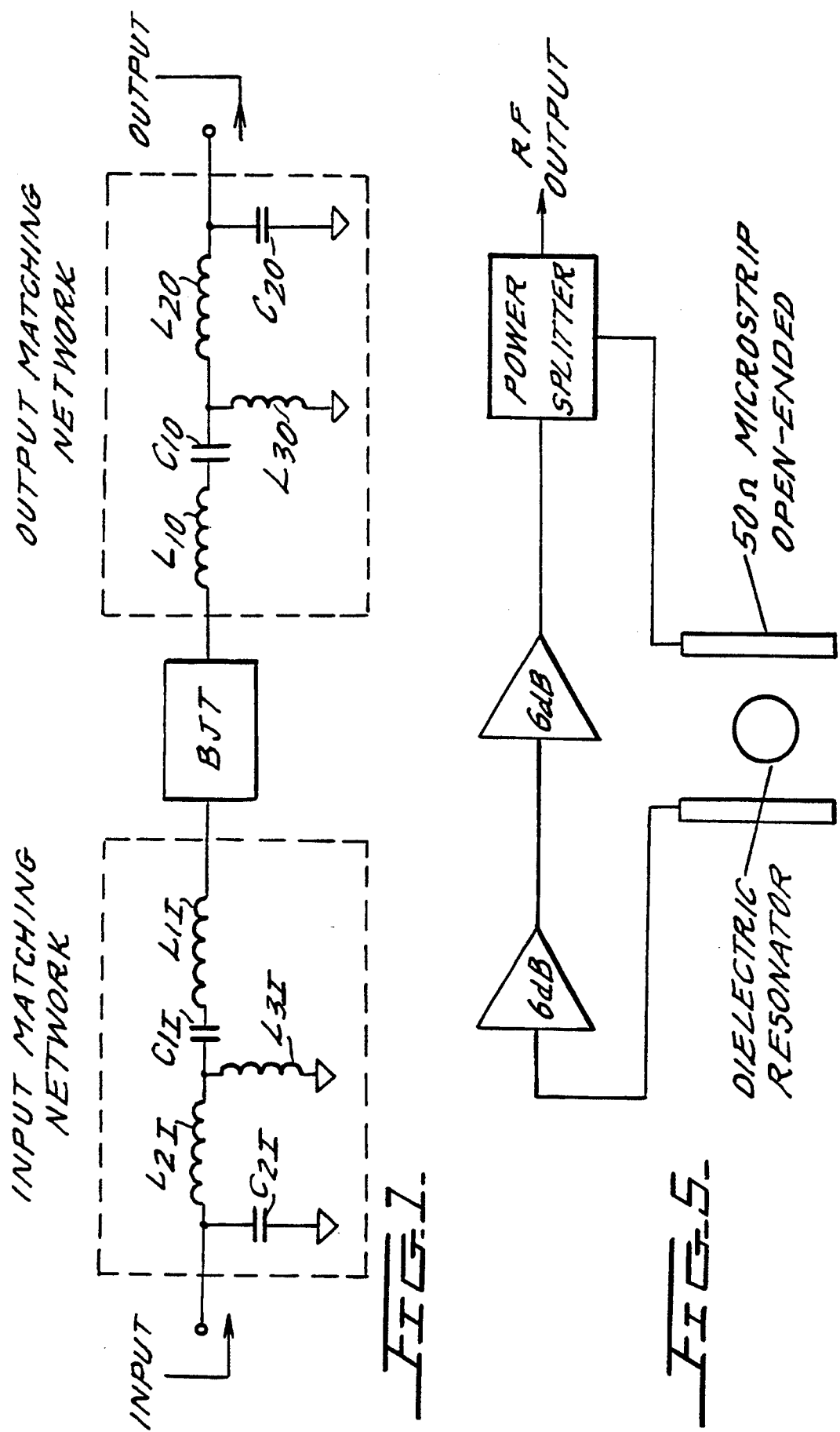
FIG. 1 is a schematic diagram of an X-band BJT amplifier according to an embodiment of the present invention.

A schematic diagram of an X-band amplifier which embodies the invention can be seen in FIG. 1. The input matching network is designed to provide a conjugate match for maximum small-signal gain. An inductance $L_{1I}$ is used to rotate the impedance looking into the transistor. A capacitance $C_{1I}$ is used to block DC signals. An inductance $L_{3I}$ forms a circle on the real axis. An inductance $L_{2I}$ and a capacitance $C_{2I}$ transform the circle to a source impedance, in the present case, 50 ohms.

The output matching network is identical in topology to the input matching network. However the output impedance of the amplification stage is different from the input impedance. Therefore $L_{10}$, $L_{20}$, $L_{30}$, $C_{10}$ and $C_{20}$ will have different values from those of the corresponding input components.

Figure 2:
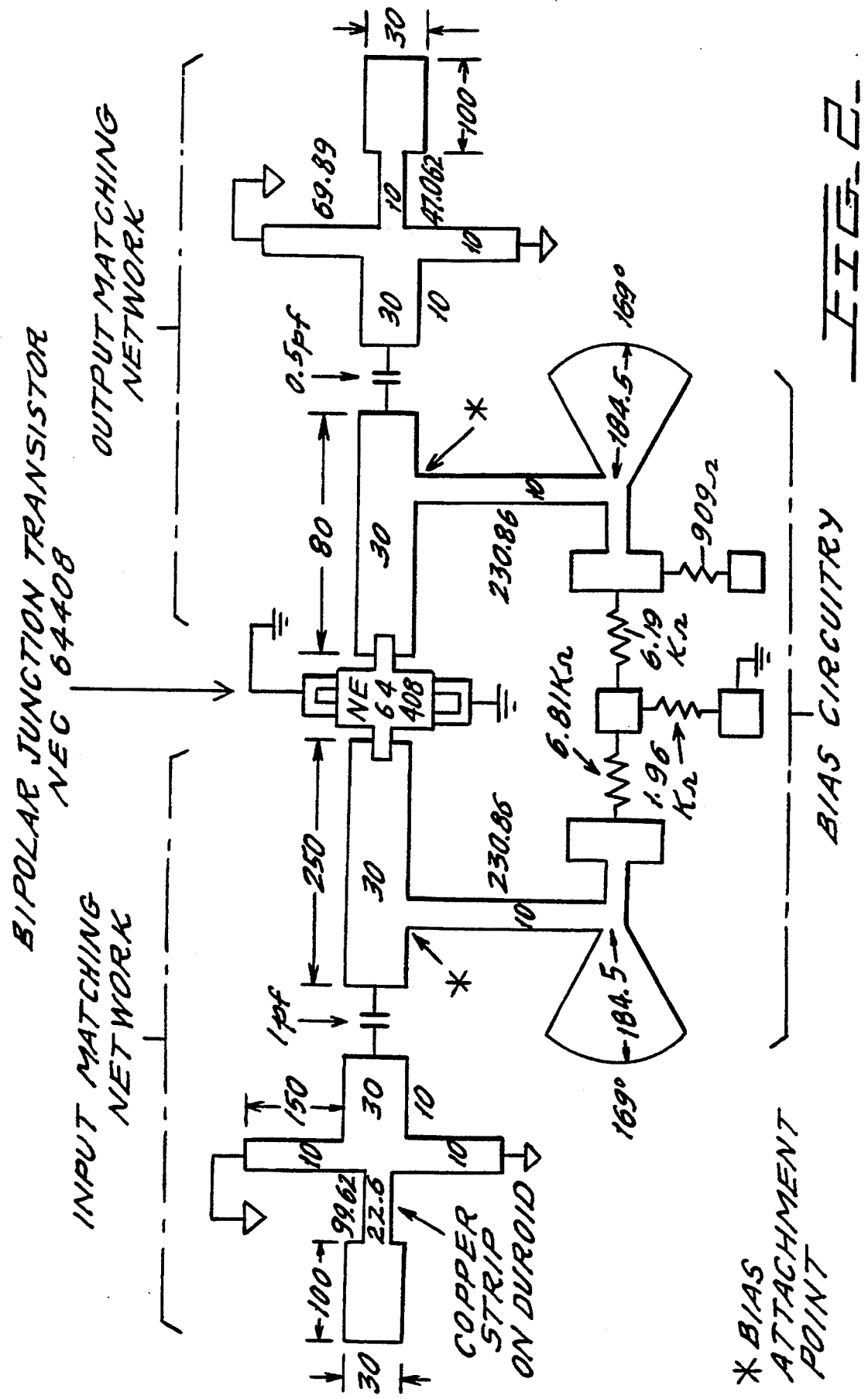
FIG. 2 is a schematic diagram of a microstrip implementation of the X-band BJT amplifier.

A microstrip implementation of the lumped element design of FIG. 1 is shown in FIG. 2. The circuit is constructed on a 10-mil-thick Duroid board with copper cladding on both sides of the board. The relative dielectric constant of Duroid is about 2.2. Duroid was selected because of its high Q. Standard photolithographic techniques were used for fabrication.

The amplification stage includes a commercially available silicon bipolar junction transistor, for example NE64408, and a standard biasing network. The transistor was operated above the upper frequency limit of 6 GHz specified by the manufacturer. Therefore, the selection of the correct biasing point is critical if maximum gain is to be obtained. The bias attachment point was found by probing different parts of the input and output network. The point is insensitive to gain variation.

Figure 3:
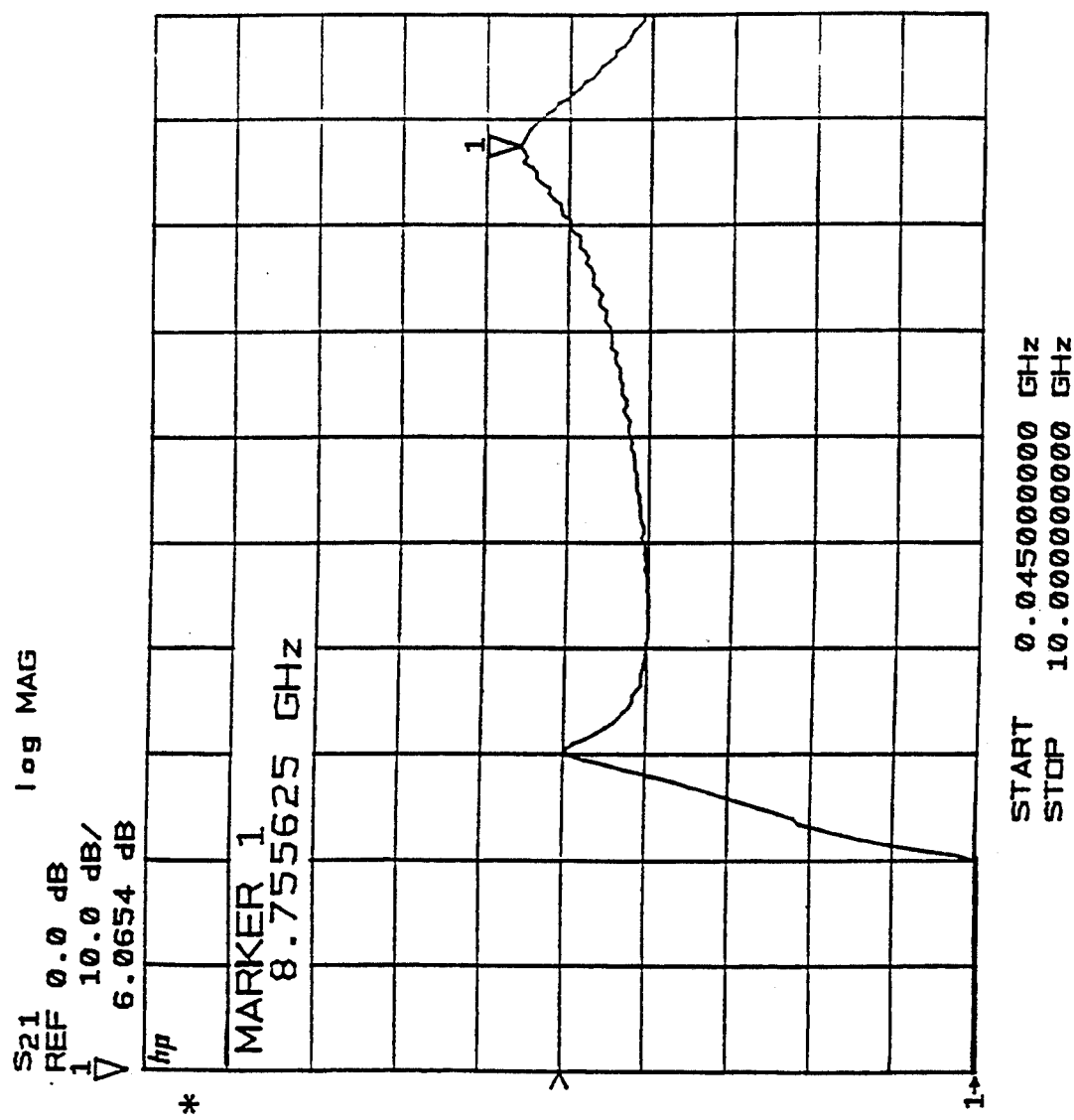
FIGS. 3 and 4 are gain profiles illustrating gain vs. frequency over a broad frequency range and a narrow frequency range, respectively.
Figure 4:
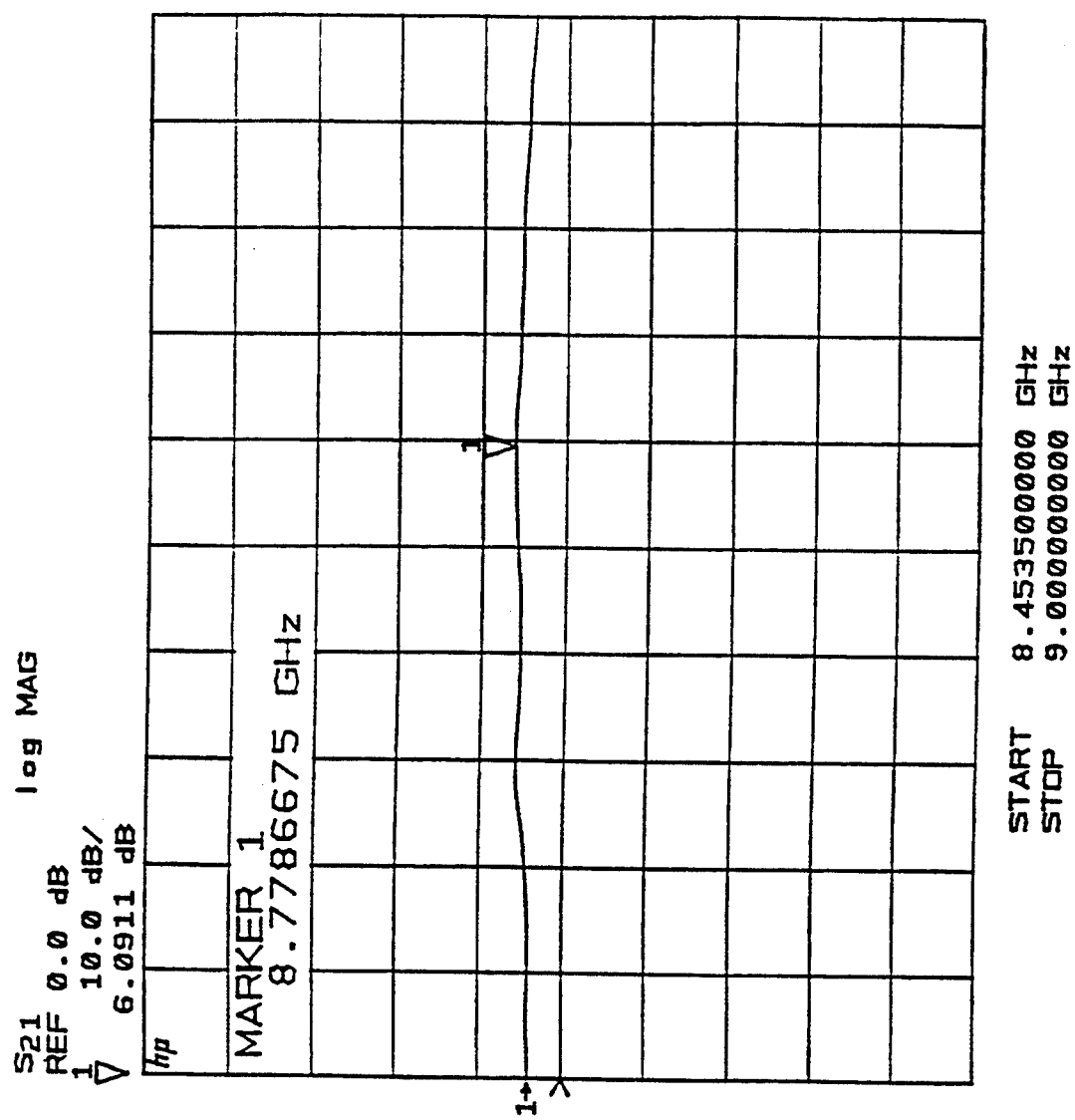

Once the board was fabricated and the components comprising the biasing, matching and amplification circuitry were assembled in a suitable fixture, performance verification began. The results of the testing can be seen in FIGS. 3 and 4. The amplifier had a gain of 6 dB at 8.78 GHz. Tuning of the amplifier will improve the overall performance. The gain of the amplifier can be increased by 6 dB to 8 dB by tuning the input and output matching networks. Tuning is achieved by trimming the shorted stub and/or by changing the capacitance values.

Besides constructing this device on Duroid, this X-band BJT amplifier can also be designed to work on metallized ceramic substrates, such as gold on alumina. The amplifier can also be designed with discrete components instead of a hybrid design which is implied with the microstrip version.

The novel microstrip input and output matching network is designed to provide optimal source and load impedance for maximum gain and is the preferred mode of building this device. The X-band BJT amplifier will have improved noise performance, on the order of a 10-30 dB improvement, over a GaAs FET amplifier in this frequency regime. This BJT amplifier is reliable, cost-effective and based on a simple novel design.

The X-band BJT amplifier when used in an oscillator will have superior noise performance, but the output power will not be as large as in an oscillator that uses a gallium arsenide field effect transistor (GaAs FET) amplifier in the oscillator loop. Therefore, to obtain the improved noise performance along with increased output power, a low-noise GaAs FET amplifier (not shown) can be used to augment the output power of the oscillator external to the oscillator loop. This addition will dramatically increase output power while preserving the superior noise performance of the oscillator.

FIG. 5 shows the BJT amplifier incorporated in a dielectric resonator oscillator. As seen, it is preferred that two amplifiers be utilized to overcome the insertion loss of the dielectric resonator and power splitter loss. As shown, there is a feedback circuit which receives a signal from the amplifier output terminal and feeds back the signal to the amplifier input terminal. This feedback circuit is formed on the board and in connected to the amplifier input terminal via a power splitter which has an input terminal and two output terminals wherein the input terminal is connected to the amplifier output terminal and the two output terminals output the signal to an RF output as an output signal of the oscillator and feeds back the signal to the amplifier through open-ended microstrip lines. As those skilled in the art will readily appreciate, even a second feedback circuit may be formed on the board and connected to the power splitter RF output terminal. This second feedback circuit will feed back the RF output to the first feedback circuit. The pair of 50-ohm open-ended microstriplines are respectively connected to the amplifier input and output terminals. The microstriplines are both coupled to a dielectric resonator mounted between them on the Duroid board.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An X-band low-noise, small-signal amplifier for operation in the frequency range of 8-12.5 GHz, comprising:

input means for receiving an X-band signal, said input means including input and output means and an input impedance matching network; said input impedance matching network including a series connection of a first inductor, a first capacitor and a second inductor extending from the BJT to the input terminal in that ordering third inductor connected between the ground and the connection point of said first capacitor and said second inductor, and a second capacitor connected between the ground and input terminals;

a two port bipolar junction transistor (BJT) being capable of operating between 8 and 12.5 GHz and having an input electrode, an output electrode, and a ground electrode, said input electrode being connected for receiving said signal from said input means, said output electrode delivering an amplified signal from said transistor, and said ground electrode being grounded; and output means for receiving said amplified signal from said output electrode and providing said amplified signal to further circuitry, said output means including second input and output terminals and an output impedance matching network; said output impedance matching network including a series connection of a fourth inductor, a third capacitor and a fifth inductor extending from the BJT to the second output terminal in that order, a sixth inductor connected between the ground and the connection point of said third capacitor and said fifth inductor, and a fourth capacitor connected between the ground and the second output terminal;

wherein all the foregoing components we disposed on a dielectric board, wherein each said inductor comprises a microstrip formed on said board, and wherein at least one of said capacitors is formed by a pair of cladding portions formed on opposite sides of said board.

2. An amplifier as in claim 1, wherein said cladding is copper and said board consists essentially of 10-mil Duroid having a dielectric constant of at least about 2.

3. An amplifier as in claim 1, wherein each said inductor comprises a microstrip formed on said board.

4. An amplifier as in claim 3, further comprising BJT mounting means on said board for receiving said input, output, and ground electrodes of said BJT, and wherein said microstrips and said BJT mounting means are formed by cladding portions on a dielectric board.

5. An X-band oscillator comprising in combination:
the amplifier of claim 1; and
a feedback circuit which receives a signal from said amplifier output terminal and feeds back said signal to said amplifier input terminal.

6. An oscillator as in claim 5, further comprising a second amplifier connected in series with said first-mentioned amplifier.

7. An oscillator as in claim 5, wherein said feedback circuit comprises:
first feedback means formed on said board and connected to said amplifier input terminal;
a power splitter having an input terminal and first and second output terminals, said input terminal being connected to said amplifier output terminal, such that said first output terminal outputs a first portion of a signal received from said amplifier as an output signal of said oscillator; and such that said second output terminal feeds back a second portion of a signal received from said amplifier output terminal; and
second feedback means formed on said board and connected to said second power splitter output terminal for feeding back said second signal portion to said first feedback means.

8. An oscillator as in claim 7, wherein said first and second feedback means comprise first and second microstriplines, respectively.

9. An oscillator as in claim 8, wherein said microstriplines are 50-ohm open-ended microstriplines.

10. An oscillator as in claim 8, further comprising a dielectric resonator disposed on said board and coupled to said first and second microstriplines.

* * * * *